United States Patent
Lipinski

(10) Patent No.: US 6,835,663 B2
(45) Date of Patent: Dec. 28, 2004

(54) HARDMASK OF AMORPHOUS CARBON-HYDROGEN (A-C:H) LAYERS WITH TUNABLE ETCH RESISTIVITY

(75) Inventor: Matthias Lipinski, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 195 days.

(21) Appl. No.: 10/184,127

(22) Filed: Jun. 28, 2002

(65) Prior Publication Data

US 2004/0000534 A1 Jan. 1, 2004

(51) Int. Cl.$^7$ .............................................. H01L 21/00
(52) U.S. Cl. ........................ 438/695; 438/696; 438/700; 438/720; 216/49; 216/51; 216/67; 216/79; 216/81
(58) Field of Search .............................. 216/49, 51, 67, 216/79, 81; 438/696, 700, 720

(56) References Cited

U.S. PATENT DOCUMENTS

| | | | |
|---|---|---|---|
| 5,354,421 A | | 10/1994 | Tatsumi et al. |
| 5,378,316 A | * | 1/1995 | Franke et al. .................. 216/2 |
| 5,427,985 A | | 6/1995 | Hammerschmidt et al. |
| 5,750,316 A | | 5/1998 | Kawamura et al. |
| 5,759,920 A | | 6/1998 | Burns, Jr. et al. |
| 5,830,332 A | | 11/1998 | Babich et al. |
| 6,080,445 A | | 6/2000 | Sugiyama et al. |
| 6,287,951 B1 | | 9/2001 | Lucas et al. |
| 6,316,167 B1 | | 11/2001 | Angelopoulos et al. |
| 6,392,244 B1 | | 5/2002 | Grannen et al. |
| 6,420,095 B1 | * | 7/2002 | Kawamura et al. ......... 438/313 |

FOREIGN PATENT DOCUMENTS

| | | |
|---|---|---|
| EP | 0933802 B1 | 4/2002 |
| WO | WO 92/17900 | 10/1992 |

OTHER PUBLICATIONS

Deng, K., et al., Application Of Diamond–Like Carbon Film For Microdynamic Devices, 5$^{th}$ Technical Digest, IEEE, 1992, pp. 98–101 (Jun. 22–25, 1992).

Muller, D.E., et al., "Plasmas," Plasma Science, 1995, IEEE Conference Record—Abstracts., p. 264, (Jun. 5–8,1995).

Yamamoto, T., et al., "Ultrathin Amorphous C:H Overcoats by pCVD on Thin Film," IEEE Transactions on Magnetics, vol. 36, No. 1 (Jan. 2000) pp. 115–119.

Urruchi W.I., et al., "Etching of DLC Films Using a Low Intensity Oxygen Plasma Jet," Diamond and Related Materials 9 (2000) pp. 685–688.

Balachova, O.V., et al., "$CF^4$ Plasma Etching of Materials Used in Microelectronics Manufacturing," Microelectronics Journal 31 (2000) pp. 213–215.

German International Search Report for Application No. DE 10328578 dated Feb. 2, 2004.

Van De Sanden, M.C.M., et al., Fast Deposition of a–C:H and a–Si:H Using an Expanding Thermal Plasma Beam,38 Plasma Science, 1993, IEEE Conference Records—Abstracts, 1993 International, Conference, p. 225, Jun. 7–9, 1993.

Komatsu, Y., et al., "Application of Diamond–Like Carbon Films to the Integrated Circuit Fabrication Process," Diamond and Related Materials 8 (1999) 2018–2021.

Oehrlein, G.S., et al., "Sidewall Surface Chemistry in Directional Etching Processes," Materials Science and Engineering, 24 (1998) 153–183.

* cited by examiner

*Primary Examiner*—Allan Olsen
(74) *Attorney, Agent, or Firm*—Slater & Matail, L.L.P.

(57) ABSTRACT

A process of using a-C:H layer as a hardmask material with tunable etch resistivity in a RIE process that alleviates the addition of a layer forming gas to the etchant when making a semiconductor device, comprising:

a) providing a semiconductor substrate;

b) forming a hardmask of amorphous carbon-hydrogen (a-C:H) layer by plasma enhancement over the semiconductor substrate;

c) forming an opening in the hardmask layer to form an exposed surface portion of the hardmask layer; and d) etching the exposed surface portion of the hardmask layer without the addition of a layer forming gas using RIE to form a trench feature with sufficient masking and side wall protection.

11 Claims, No Drawings

HARDMASK OF AMORPHOUS CARBON-HYDROGEN (A-C:H) LAYERS WITH TUNABLE ETCH RESISTIVITY

BACKGROUND OF THE INVENTION

1. Field of Invention

The invention relates to the use of amorphous carbon-hydrogen (a-C:H) layers as hardmask material with tunable etch resistivity and use of these hardmasks in reactive ion etching (RIE) processes.

2. Description of the Prior Art

Because of the increase in complexity and reduction in the minimum feature sizes of circuit elements when fabricating microelectronic devices, contemporary exposure tools and highly sensitive photoresists are utilized to generate micrometer and sub micrometer pattern sizes. Further, because wet etching during fabrication causes several critical problems in pattern transfer of fine geometries, reactive ion etching (RIE) [which is characterized by low pressures and high-ion-bombardment energies] is used as it has several advantages over wet chemical etching. The advantages are: adhesion problems are not critical with plasma etching techniques; dry etching operations require small amounts of chemicals; and plasma-etching can be fully automated. Finally, RIE is especially useful because of its ability to etch anisotropically at low temperatures.

With decreasing feature size, the depth of focus of lithography also decreases and leads to reduced mass thickness, and this soft mass thickness is no longer sufficient to grant an adequate manufacturable process window for etch processes. For this reason, a lot of hardmask processes are becoming the state of the art. Nevertheless, many hardmask processes are dominated by chemical etching which is problematic, in that, i.e. in the case of Al RIE or Si etch, redeposited photoresist can be essential to provide sidewall passivation and thereby enable obtaining an anisotropic profile. Contemporarily, when using the state of the art hardmask processes, this sidewall protection mechanism is no longer available and this makes critical dimension (CD) control very difficult.

A fast deposition of a-C:H using an expanding thermal plasma beam is disclosed in van de Sanden et al., Plasma Science, 1993. IEEE Conference Record—Abstracts., 1993 IEEE International Conference on pages(s): 225 Jun. 7–9, 1993. This fast deposition method utilizes a thermal plasma which expands into a vacuum vessel to deposit a-C:H— wherein the deposited layer is produced by mixing methane or acetylene to argon carrier plasma.

The application of diamond-like carbon films to the integrated circuit fabrication process is disclosed by Komatsu et al. in Diamond-And Related Materials 8 (1999) 2018–2021. The amorphous diamond-like carbon (DLC) films have been developed as resist materials for lithography and as hard coatings, and the etching properties of these DLC films were obtained by first using a parallel-plate rf plasma glow discharge, methane gas decomposed for deposition of the DLC film on a substrate, and the use of oxygen to etch the film. The etching rate of the DLC films increase with decreased oxygen pressure. At high pressure, isotropic etching by neutral radicals occurred, since the shape of the etched edge was not vertical. The top and bottom edges coincided vertically at low pressure because of high bias voltage.

Sidewall surface chemistry in directional etching processes is disclosed by Oehrlein et al. in Materials Science and Engineering, 24 (1998) 153–183. This publication reviews the approaches used for silicon, aluminum, $SiO_2$ and polymeric materials to suppress etching reactions at microstructure sidewalls, where the prerequisite of successful microstructure fabrication in electronic materials using plasma-base etching entails the ability to maximize the ratio of ion-enhanced etching reactions relative to spontaneous etching reactions, in view of the fact that, to produce vertical etching profiles, the rate of etching reaction in line-of-sight of the plasma has to be large, whereas the lateral etching rate should vanish.

U.S. Pat. No. 6,316,167 B1 discloses tunable vapor deposited materials as antireflective coatings, hardmask, and as combined antireflective coating/hardmask. The lithographic structure comprises a plurality of layers at least one of which is an RCHX layer which comprises a material having the structural formula R:C:H:X, wherein R is selected from the group consisting of Si, Ge, B, Sn, Fe, Ti and combinations thereof and wherein X is not present or is selected from the group consisting of one or more of O, N, S, and F and a layer of an energy active material.

There is a need, especially in the case of processes dominated by chemical etchings (i.e. Al RIE) to provide good selectivity of a potential hardmask material that is sufficient for a controllable process, because the selectivity of hardmask materials to the material that has to be etched is comparatively high, and therefore, the amount of redeposited materials is not sufficient to reliably protect the sidewalls of the growing features in the etch process.

SUMMARY OF THE INVENTION

An objective of the present invention is to provide an amorphous carbon-hydrogen (a-C:H) layer as a hardmask material with tunable etch resistivity for RIE processes dominated by chemical etching.

DETAILED DESCRIPTION OF PREFERRED EMBODIMENT OF THE INVENTION

Different hard mask materials are currently being used in RIE and some of these materials are W, $SiO_2$, SiON, SiOC, and SIC. All of these materials have a high selectivity to the materials to be etched and are therefore in general, suitable for hard mask applications.

In the case of processes dominated by chemical etching (i.e. Al RIE) a good selectivity of a potential hard mask material is not sufficient for a controllable process. This is so because, with this kind of etching an anisotropic profile cannot be achieved by simply applying a highly directed plasma, due to the fact that reactive species are uncharged and therefore their moving directions are not restricted to the direction of the electrical field. In fact, for this kind of etch process an excellent sidewall passivation is essential.

With previous resist processes this sidewall passivation has been provided by the photoresist itself, which in course of the etch is redeposited at the sidewalls. However, this kind of sidewall passivation is no longer available with current hard mask processes. Because the selectivity of hard mask materials to the material to be etched is comparably high, the amount of material available for redeposition on the sidewalls is in general not sufficient to reliably protect those side walls of the growing features.

Up to now there have been two methods of approach to this problem:

(1) The photoresist is allowed to stay in place after the hard mask has been opened. That way, the photoresist is still available when the etch starts. Since the resist will be completely consumed before the etch is finished, a significant change in the sidewall passivation mechanism occurs in the middle of the etch process (which is disadvantageous in case of comparably low stacks and a real problem in the case of higher stacks); and (2) The photoresist is striped after the hard mask has been opened. This way an intermediate change in the sidewall passivation mechanism is avoided. Since (for inherent reasons) hardmask materials are not capable of providing sufficient redeposition/sidewall passivation, it is necessary to add another component to the etch chemistry to provide the passivation. This component may be i.e. a hydrocarbon which is known to easily form dense layers under the influence of a plasma. However, the disadvantage of this process scheme is that this passivation layer is deposited not only at the sidewalls of the growing features, but at the same time, in the whole etch chamber. This makes an increased maintenance effort necessary since hydrocarbon deposits are known to crack, peel off and form particles when a critical thickness has been exceeded.

The invention solves the foregoing problems by depositing amorphous carbon-hydrogen layers in a plasma of gaseous organic compounds, mixtures of different gaseous organic compounds or mixtures of gaseous organic and inorganic compounds. These layers are also referred to as DLC layers (diamond like carbon) or as plasma polymers; however, there is no exact definition for these terms. While DLC in general stands for a mechanically hard material that is characterized by a high content of $sp^3$ configurated carbon atoms, the hardness of plasma polymers almost compares to the hardness of conventional polymers. Therefore, the most comprehensive expression for these layers is an amorphous carbon-hydrogen layer.

While these DLC layers are deposited by plasma enhancement from the same kind of gases, the plasma parameters in general determine what kind of layer is obtained. High plasma power and high bias voltages of about 800V or more lead to mechanically hard and highly crosslinked layers. On the other hand, in the low power regime of about 20V softer materials with a lower degree of crosslinking are deposited. In between, these properties can gradually be varied simply by adjusting the plasma parameters.

The key issue of the present invention disclosure is that this variation in the film properties (degree of crosslinking, $sp^3/sp^2$ ratio, hardness) also influences the etch resistance of this material. Material deposited in the high power regime has an etch resistivity comparable to other hard mask materials (such as W, $SiO_2$, SiON, SiOC) or even higher. In the low power regime (plasma polymer) the material has an etch resistivity in the same order of magnitude as a photoresist. In between these extreme sets of plasma parameters, the etch resistivity of a-C:H films can be tailored exactly to the needs of the application, from photoresist-like to hard mask-like. Other hard mask materials do not offer this possibility because they are inorganic materials and therefore allow a limited amount of different stoichiometries, if any, which leads to a very limited range of different etch resistivities.

Some of the current hard masks offer etch resistivities that are more than sufficient (i.e. W hard mask for Al RIE) but lack of sidewall passivation because there is only little material removed (which at the same time means that very little material can be redeposited).

Therefore, it would be advantageous to waive part of the etch resistivity if one could get improved sidewall passivation instead. This is precisely what can be done with an a-C:H hard mask, but cannot be done with other hard mask materials. With an etch resistivity adjusted some where in between the typical hard masks and photoresist, it is possible to get both sufficient masking and side wall protection, without an additional etch gas component. Consequently, the etch resistivity of the a-C:H layer can be adjusted to the needs of each etch application (i.e. stack height, etch conditions, etc.)

The use of a-C:H films as hard mask further results in increased process windows and process stability because there is no change of the sidewall passivation mechanism in the middle of the process. Also, the addition of a layer forming gas to the etchant is no longer necesary and this increases maintenance intervals and simplifies the process.

Further advantages of utilizing a-C:H material are as follows:

1) a-C:H can be patterned by oxygen or hydrogen plasmas;
2) The material can be used as antireflective coatings. For example, in the case of the following two layer structure: During the first part of the deposition the plasma parameters are chosen so that the masking material is obtained. When the desired film thickness has been deposited the plasma parameters are switched to a set that gives the antireflective coating; and
3) a-C:H can be dry stripped under the same conditions as the photoresist.

In plasma etch processes used to define microscopic features for integrated circuits, there are differences in the surface chemical processes that occur on the surface portions in the line-of-sight of the plasma and at the sidewalls of the microstructure being etched, and these differences are of critical importance in determining the surface profile of the final microstructure. For example, if the straight sidewalls are sought, either no reaction should occur at the sidewall or the deposition and etching rates must be exactly balanced. However, since this ideal is not achieved one is left with either a net etching or net deposition reaction result at the sidewalls. The net deposition reaction at the sidewalls form films known as sidewall passivation layers. Since these sidewall passivation layers slow down or stop the lateral attack of etchant species, it is important to control the process.

In general, the invention process of using a-C:H layers as hardmask materials with tunable etch resistivity in a RIE process that alleviates the addition of a layer forming gas to the etchant when making a semiconductor device is accomplished by:

a) providing a semiconductor substrate;

b) forming a hardmask of amorphous carbon-hydrogen (a-C:H) layer by plasma enhancement over said semiconductor substrate;

c) forming an opening in the hardmask layer to form an exposed surface portion of the hardmask layer; and d) etching the exposed surface portion of the hardmask layer without the addition of a layer forming gas using RIE to form a trench feature with sufficient masking and side wall protection.

I claim:

1. A process of using an a-C:H layer as a hardmask material in a RIE process when making a semiconductor device, comprising:

providing a semiconductor substrate;

adjusting the parameters of plasma enhancement used to deposit a layer of amorphous carbon-hydrogen (a-C:H) layer to obtain a selected etch resistance of said layer;

depositing a mask layer of amorphous carbon-hydrogen (a-C:H) over said semiconductor substrate using said adjusted parameter of plasma enhancement, said mask layer having a top surface;

forming an opening in the mask layer to form exposed sidewalls in said mask layer and an exposed surface portion of the semiconductor substrate;

etching material from said amorphous carbon-hydrogen (a-C:H) mask layer and the exposed surface portion of the semiconductor substrate without the addition of a layer forming gas using RIE to from a trench feature defining sidewalls; and re-depositing a portion of the material etched from said mask layer to selectively passivate said sidewalls of said trench.

2. The process of claim 1, wherein between said steps of depositing and etching, an antireflective layer of amorphous carbon-hydrogen (a-C:H) is formed overlying said mask layer.

3. The process of claim 1 wherein said step of depositing an amorphous carbon-hydrogen (a-C:H) layer uses a plasma comprising a compound selected from the group consisting of a gaseous organic compound, mixtures of different gaseous organic compounds or mixtures of gaseous organic compounds and inorganic compounds.

4. The process of claim 3 wherein said RIE is Al RIE.

5. The process of claim 4 wherein said plasma includes oxygen.

6. The process of claim 4 wherein said plasma includes hydrogen.

7. The process of claim 4 wherein said plasma includes argon.

8. The process of claim 7 wherein methane is admixed with said argon.

9. The process of claim 7 wherein acetylene is admixed with said argon.

10. The process of claim 1 wherein an insulating layer is formed between said providing step and said depositing step.

11. The process of claim 10 wherein an adhesion layer comprising silicon is formed over said insulating layer, prior to said depositing step.

* * * * *